United States Patent
Oh

(10) Patent No.: US 10,536,652 B2
(45) Date of Patent: Jan. 14, 2020

(54) IMAGE SENSORS WITH SPLIT PHOTODIODES

(71) Applicant: SEMICONDUCTOR COMPONENTS INDUSTRIES, LLC, Phoenix, AZ (US)

(72) Inventor: Minseok Oh, San Jose, CA (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 90 days.

(21) Appl. No.: 15/864,164

(22) Filed: Jan. 8, 2018

(65) Prior Publication Data

US 2019/0215471 A1  Jul. 11, 2019

(51) Int. Cl.
*H04N 3/14* (2006.01)
*H04N 5/335* (2011.01)
(Continued)

(52) U.S. Cl.
CPC ... *H04N 5/35554* (2013.01); *H01L 27/14607* (2013.01); *H01L 27/14609* (2013.01);
(Continued)

(58) Field of Classification Search
CPC ...... H04N 5/378; H04N 5/2254; H04N 5/359; H01L 27/14649; H01L 27/14621; H01L 14/645; H01L 14/14636; H01L 14/14654; H01L 14/14627; H01L 14/14634; H01L 14/1463; H01L 14/14643
See application file for complete search history.

(56) References Cited

U.S. PATENT DOCUMENTS 9,344,647 B2   5/2016 Agranov et al.
9,942,503 B2 * 4/2018 Velichko ........... H01L 27/14627
(Continued)

FOREIGN PATENT DOCUMENTS

EP    1887626 A1   2/2008
WO  2013008425 A1   1/2013

OTHER PUBLICATIONS

M. Sakakibara et. el. "An 83dB-Dynamic-Range Single-Exposure Global-Shutter CMOS Image Sensor with In-Pixel Dual Storage", in ISSCC 2012 Proc., pp. 380-382, Feb. 2012.
(Continued)

*Primary Examiner* — Kelly L Jerabek
(74) *Attorney, Agent, or Firm* — Treyz Law Group, P.C.; David K. Cole

(57) ABSTRACT

An imaging device may have an array of image sensor pixels. Each image sensor pixel of the array of image sensor pixels may have split photodiodes that are symmetric about a shared floating diffusion region. The floating diffusion region may be coupled to each of the photodiodes. Each of the split photodiodes and the floating diffusion region may generate charge in response to light incident on the image sensor pixel. The split photodiodes and the floating diffusion region may be covered by a microlens. The charge generated by the photodiodes and the floating diffusion region may be compared and utilized by the imaging device in phase detection applications. The image sensor pixel may also include a dual conversion gain capacitor and a gain select transistor to produce high dynamic range (HDR) images.

19 Claims, 8 Drawing Sheets

(51) Int. Cl.

| | |
|---|---|
| *H04N 5/355* | (2011.01) |
| *H04N 5/378* | (2011.01) |
| *H01L 27/146* | (2006.01) |
| *H04N 5/361* | (2011.01) |
| *H04N 5/357* | (2011.01) |

(52) U.S. Cl.
CPC .. *H01L 27/14627* (2013.01); *H01L 27/14645* (2013.01); *H01L 27/14654* (2013.01); *H04N 5/378* (2013.01); *H01L 27/1463* (2013.01); *H04N 5/3575* (2013.01); *H04N 5/361* (2013.01)

(56) References Cited

U.S. PATENT DOCUMENTS

| | | | | |
|---|---|---|---|---|
| 10,075,663 | B2* | 9/2018 | Oh | H04N 5/359 |
| 10,271,037 | B2* | 4/2019 | Oh | H01L 27/14634 |
| 2006/0208161 | A1* | 9/2006 | Okita | H01L 27/14603 |
| | | | | 250/208.1 |
| 2009/0045319 | A1 | 2/2009 | Sugawa et al. | |
| 2010/0181602 | A1* | 7/2010 | Oishi | H01L 27/14603 |
| | | | | 257/225 |
| 2013/0222552 | A1 | 8/2013 | Agranov et al. | |
| 2016/0204158 | A1* | 7/2016 | Hsu | H01L 27/14643 |
| | | | | 257/459 |
| 2016/0286108 | A1* | 9/2016 | Fettig | H04N 5/2355 |
| 2017/0040360 | A1* | 2/2017 | Iizuka | H01L 27/14605 |
| 2017/0330906 | A1* | 11/2017 | Korobov | H01L 27/14605 |

OTHER PUBLICATIONS

N. Akahane, et al., "Optimum Design of Conversion Gain and Full Well Capacity in CMOS Image Sensor With Lateral Overflow Integration Capacitor," IEEE Trans. Electron Devices, vol. 56, No. 11, pp. 2429-2435, Nov. 2009.

\* cited by examiner

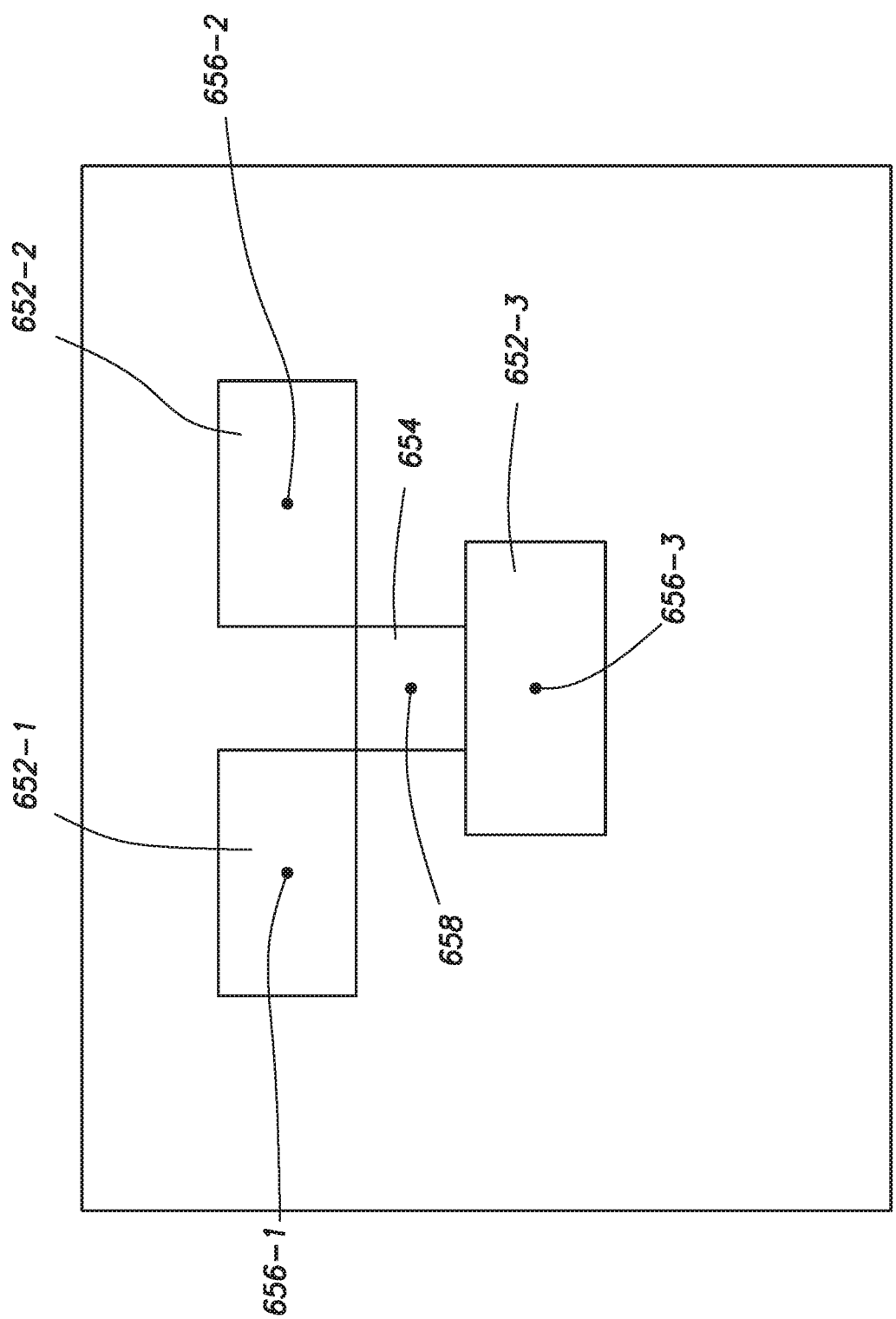

IMAGE SENSORS WITH SPLIT PHOTODIODES

BACKGROUND

This relates generally to imaging devices, and more particularly, to imaging sensor pixels that include more than one photosensitive region and that are capable of high dynamic range functionalities.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

Typical image pixels contain a photodiode for generating charge in response to incident light. Conventional imaging systems may have images with artifacts associated with low dynamic range. Scenes with bright and dark portions may produce artifacts in conventional image sensors, as portions of the low dynamic range images may be over exposed or under exposed. Image sensors may therefore be equipped with high dynamic range (HDR) functionality, where multiple images are captured with an image sensor with different exposure times. The images are later combined into a high dynamic range image, but this can introduce motion artifacts, especially in dynamic scenes with non-static objects.

It would therefore be desirable to be able to provide imaging devices with improved image sensor pixels.

BRIEF DESCRIPTION OF THE DRAWINGS

FIG. 6B is a top view of an illustrative image sensor having three symmetric, split photodiodes in accordance with an embodiment.

DETAILED DESCRIPTION

Embodiments of the present invention relate to image sensors, and more particularly, to image sensors having pixels with high dynamic range (HDR) functionality. It will be recognized by one skilled in the art, that the present exemplary embodiments may be practiced without some or all of these specific details. In other instances, well known operations have not been described in detail in order to not unnecessarily obscure the present embodiments.

Imaging systems having digital camera modules are widely used in electronic devices such as digital cameras, computers, cellular telephones, and other electronic devices. A digital camera module may include one or more image sensors that gather incoming light to capture an image. Image sensors may include arrays of image pixels. The pixels in the image sensors may include photosensitive elements such as photodiodes that convert the incoming light into electric charge. Image sensors may have any number of pixels (e.g., hundreds or thousands or more). A typical image sensor may, for example, have hundreds, thousands, or millions of pixels (e.g., megapixels). Image sensors may include control circuitry such as circuitry for operating the image pixels and readout circuitry for reading out image signals corresponding to the electric charge generated by the photosensitive elements.

Image sensor pixels may be dual gain pixels that have high dynamic range capabilities. In particular, the image sensor pixels may have multiple photosensitive regions to capture multiple images to be used in high dynamic range schemes. These photosensitive regions may be photodiodes that are arranged symmetrically about a shared floating diffusion region. The shared photodiodes and the floating diffusion region may all be configured to generate charge in response to light incident on the image sensor pixel.

Figure 1:
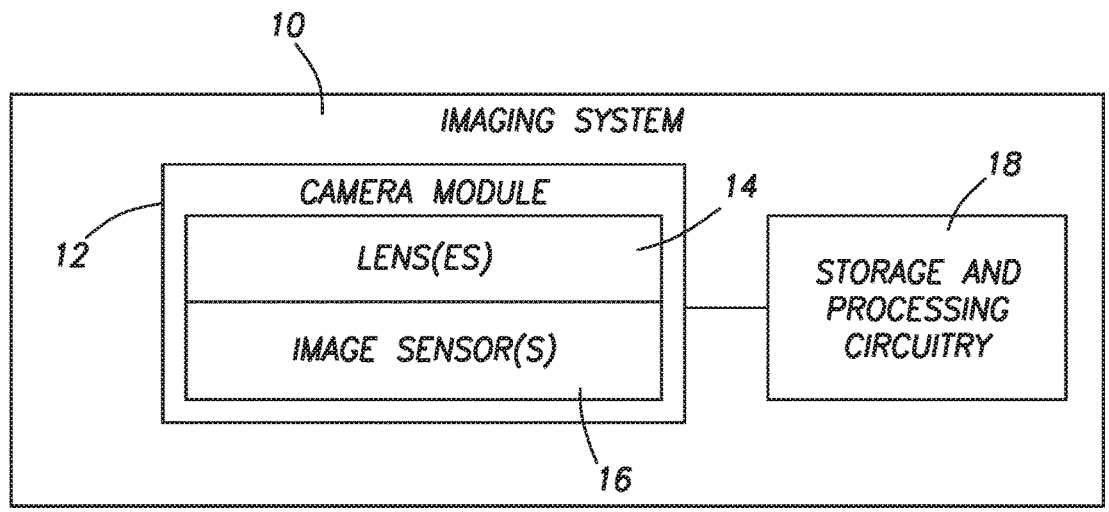
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
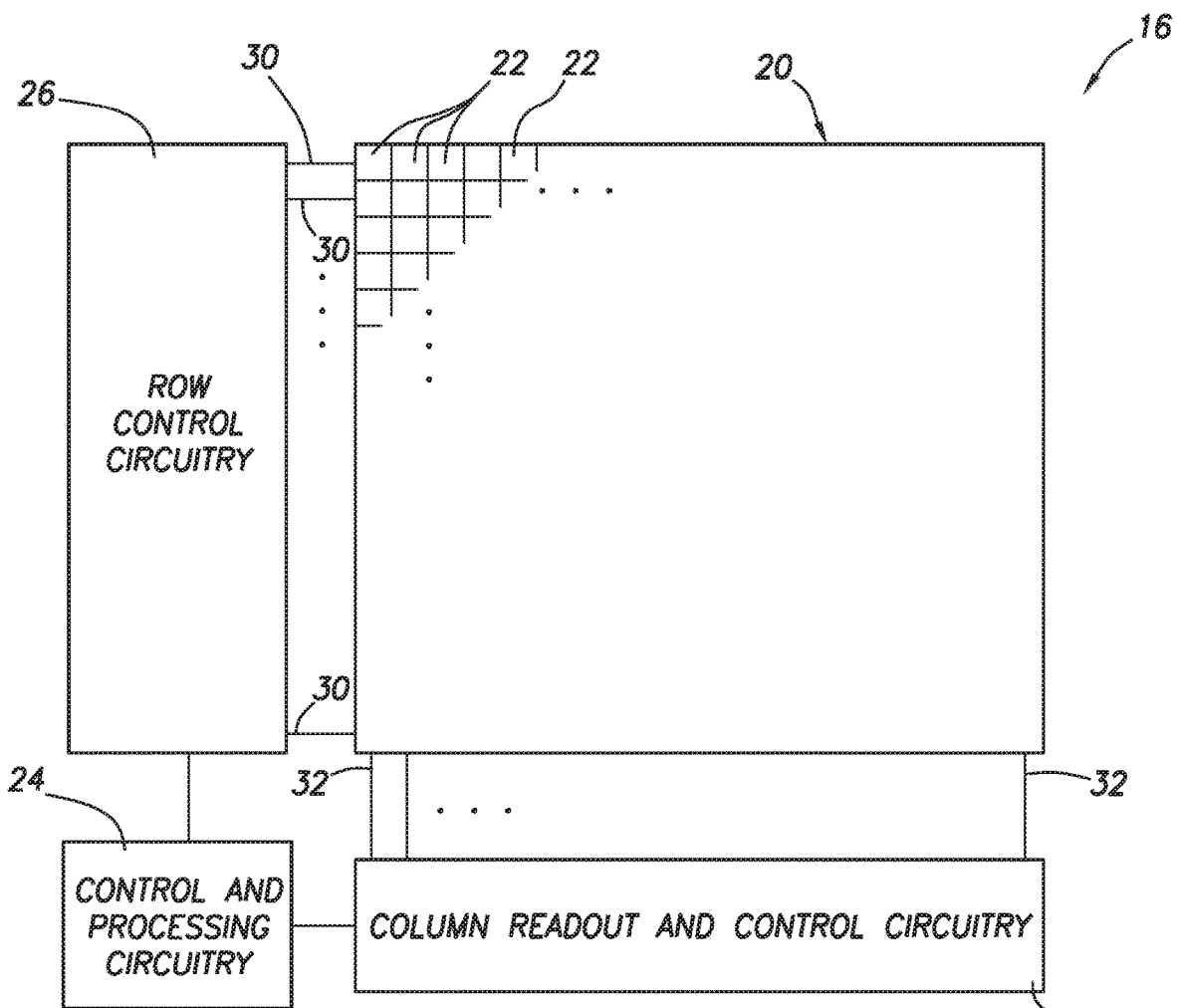
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 (sometimes referred to as column readout and control circuitry 28) may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

Image sensor 16 may be configured to support a global shutter operation (e.g., pixels 22 may be operated in a global shutter mode). For example, the image pixels 22 in array 20 may each include a photodiode, floating diffusion region, and local charge storage region. With a global shutter scheme, all of the pixels in the image sensor are reset simultaneously. A charge transfer operation is then used to simultaneously transfer the charge collected in the photodiode of each image pixel to the associated charge storage region. Data from each storage region may then be read out on a per-row basis, for example.

Figure 3:
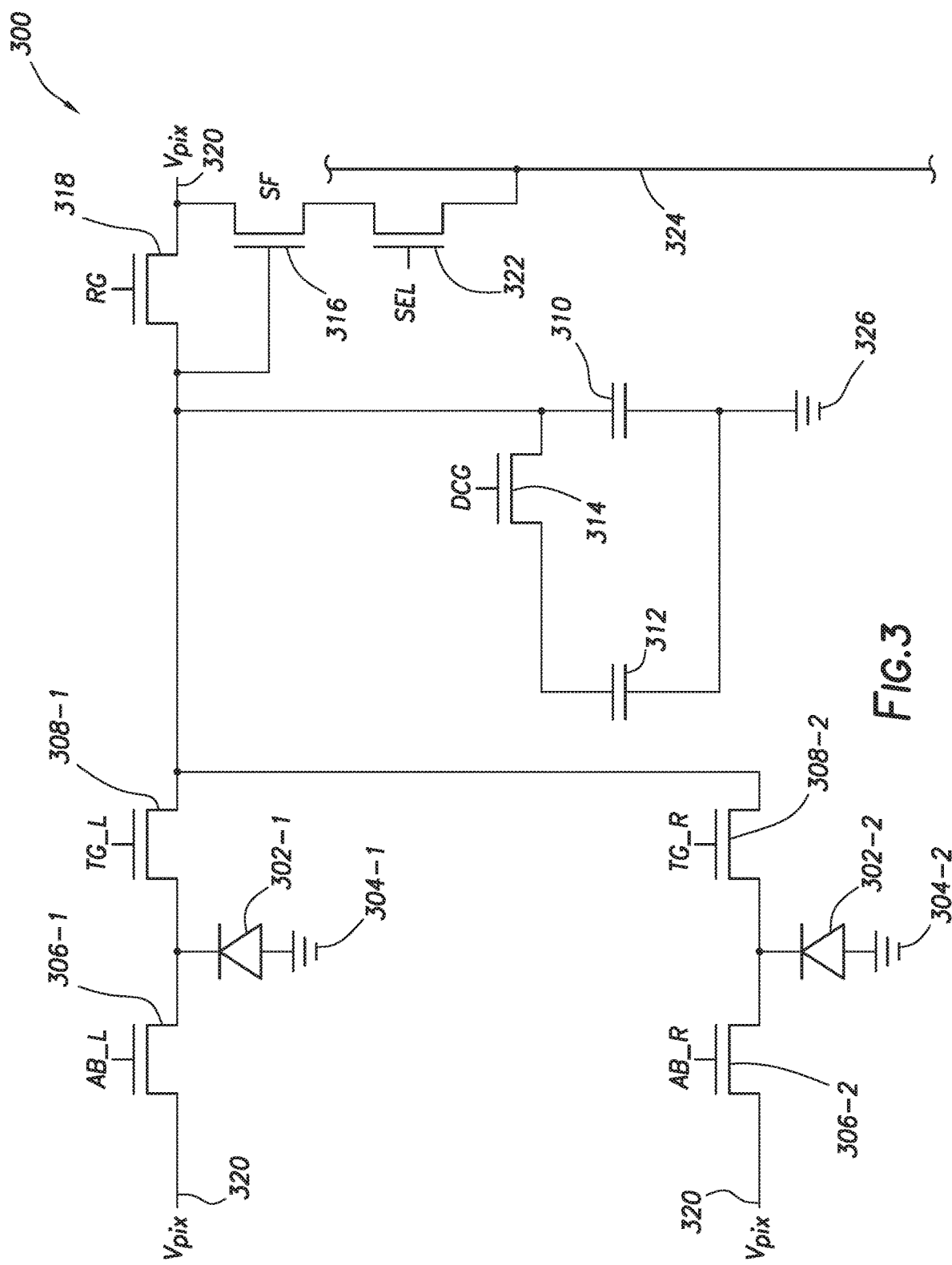
FIG. 3 is a circuit diagram of an illustrative image sensor pixel having split photodiodes in accordance with an embodiment.

FIG. 3 is a circuit diagram of a dual gain image pixel having multiple photosensitive elements. Image pixel 300 may correspond to one of the image pixels 22 shown in FIG. 2. As shown in FIG. 3, image pixel 300 includes photosensitive elements 302-1 and 302-2 (e.g., photodiodes). Photosensitive elements 302-1 and 302-2 each have first terminals that are respectively connected to grounding structures 304-1 and 304-2. The second terminal of photosensitive element 302-1 is coupled between voltage supply 320, through anti-blooming transistor 306-1, and transfer transistor 308-1. Similarly, the second terminal of photosensitive element 302-2 is coupled between voltage supply 320, through anti-blooming transistor 306-2, and transfer transistor 308-2. Transfer transistors 308-1 and 308-2 are both coupled to floating diffusion (FD) region 310, which in turn is coupled to ground 326. Gain select transistor 314 has a first terminal coupled to floating diffusion region 310 and a second terminal coupled to dual conversion gain capacitor 312. Dual conversion gain capacitor 312 is further coupled between floating diffusion region 310 and ground 326. Source-follower transistor 316 has a gate terminal coupled to transfer transistors 308, gain select transistor 314, floating diffusion region 310, and a first terminal of reset transistor 318. Source-follower transistor 316 also has a first source-drain terminal coupled between a second terminal of reset transistor 318 and voltage supply 320. In this application, each transistor is illustrated as having three terminals, a source, a drain, and a gate. The source and drain terminals of each transistor may be changed depending on how the transistors are biased and the type of transistor used. For the sake of simplicity, the source and drain terminals are referred to herein as source-drain terminals or simply terminals. A second source-drain terminal of source-follower transistor 316 is coupled to column output line 324 through row select transistor 322.

A gate terminal of transfer transistors 308-1 and 308-2 respectively receive control signals TG_L and TG_R. A gate terminal of anti-blooming transistors 306-1 and 306-2 respectively receive control signals AB_L and AB_R. A gate terminal of gain select transistor 314 receives control signal DCG. A gate terminal of reset transistor 318 receives control signal RG. A gate terminal of row select transistor 322 receives control signal SEL. Control signals TG_L, TG_R, AB_L, AB_R, DCG, RG, and SEL are provided by row control circuitry, such as row control circuitry 26 in FIG. 2.

Photodiodes 302-1 and 302-2 may generate charge (e.g., electrons) in response to receiving impinging photons. The amount of charge that is collected by photodiodes 302 depends on the intensity of the impinging light and the exposure duration (or integration time). Floating diffusion region 310 may also generate charge in response to impinging photons. For example, floating diffusion region 310 may be a doped semiconductor region (e.g., a region in a silicon substrate that is doped by ion implantation, impurity diffusion, or other doping process) that is not covered, allowing impinging light to enter the floating diffusion region. The charge collected by floating diffusion region 310 may depend on the intensity of the impinging light and the integration time. If the storage capacity of floating diffusion region 310 is not large enough to store the collected charge (e.g., in high illumination conditions), at least some of the charge may overflow and may be stored at dual conversion gain capacitor 312.

Following the charge integration at photodiodes 302 and floating diffusion region 310, control signals SEL and DCG may be asserted to turn on row select transistor 322 and gain select transistor 314 (e.g., the transistors may be closed by asserting the gate voltage to provide electrical connection between their source and drain terminals), allowing the charge generated by floating diffusion region 310 to be read out to column output line 322. Because gain select transistor 314 is asserted, both charge generated in floating diffusion region 310 that is still in floating diffusion region 310 and charge generated in floating diffusion region 310 that has overflowed into dual conversion gain capacitor 312 will all be read out. After the charge generated by the FD is read out, control signal RG may be asserted (while gain select transistor 314 is still asserted) to reset floating diffusion region 310 and dual conversion gain capacitor 312 to a known value (e.g, voltage Vpix). The floating diffusion region reset value may then be read out to column output line 324. Reading out the charge collected by floating diffusion region 310 and the reset value allows for noise and/or dark current compensation (e.g., through subtraction operations). These subtraction operations may be referred to as double sampling. Since reset voltage level readout occurs after signal readout, the double sampling readout is with uncorrelated noise (e.g., the double sampling readout is not a correlated double sampling readout). However, the double sampling readout may still reduce noise levels compared to reading out the signal level alone.

After the floating diffusion region charge and reset value have been read out, gain select transistor 314 may be deasserted and control signal RG may again be asserted to reset floating diffusion region 310, and a reset value may be read out to column output line 322. Then, control signals TG_L and TG_R may be asserted to transfer and read out the charge generated by photodiodes 302-1 and 302-2. Control signals TG_L and TG_R may be asserted simultaneously, or they may be asserted individually. Following the readout of the charge generated by both photodiodes, control signal SEL may be deasserted, and control signals AB_L, AB_R, and RG may be asserted to reset photodiodes 302, floating diffusion region 310, and dual conversion gain capacitor 312.

Gain select transistor 314 and dual conversion gain capacitor 312 may be used by pixel 300 (FIG. 3) to implement a dual conversion gain mode. In particular, pixel 300 may be operable in a high conversion gain mode and in a low conversion gain mode. If gain select transistor 314 is disabled, pixel 300 will be placed in a high conversion gain mode. If gain select transistor 314 is enabled, pixel 300 will be placed in a low conversion gain mode. When gain select transistor 314 is turned on, the dual conversion gain capacitor 312 may be switched into use to provide floating diffusion region 310 with additional capacitance. This results in lower conversion gain for pixel 300. When gain select transistor 314 is turned off, the additional loading of the capacitor is removed and the pixel reverts to a relatively higher pixel conversion gain configuration.

Although FIG. 3 depicts two photodiodes 302, this is merely an example. If desired, image sensor pixel 300 may have any number of photodiodes. For example, image sensor pixel 300 may have three photodiodes, four photodiodes, or more than four photodiodes. For each photodiode, image sensor pixel 300 may include corresponding anti-blooming and transfer transistors.

Figure 4:
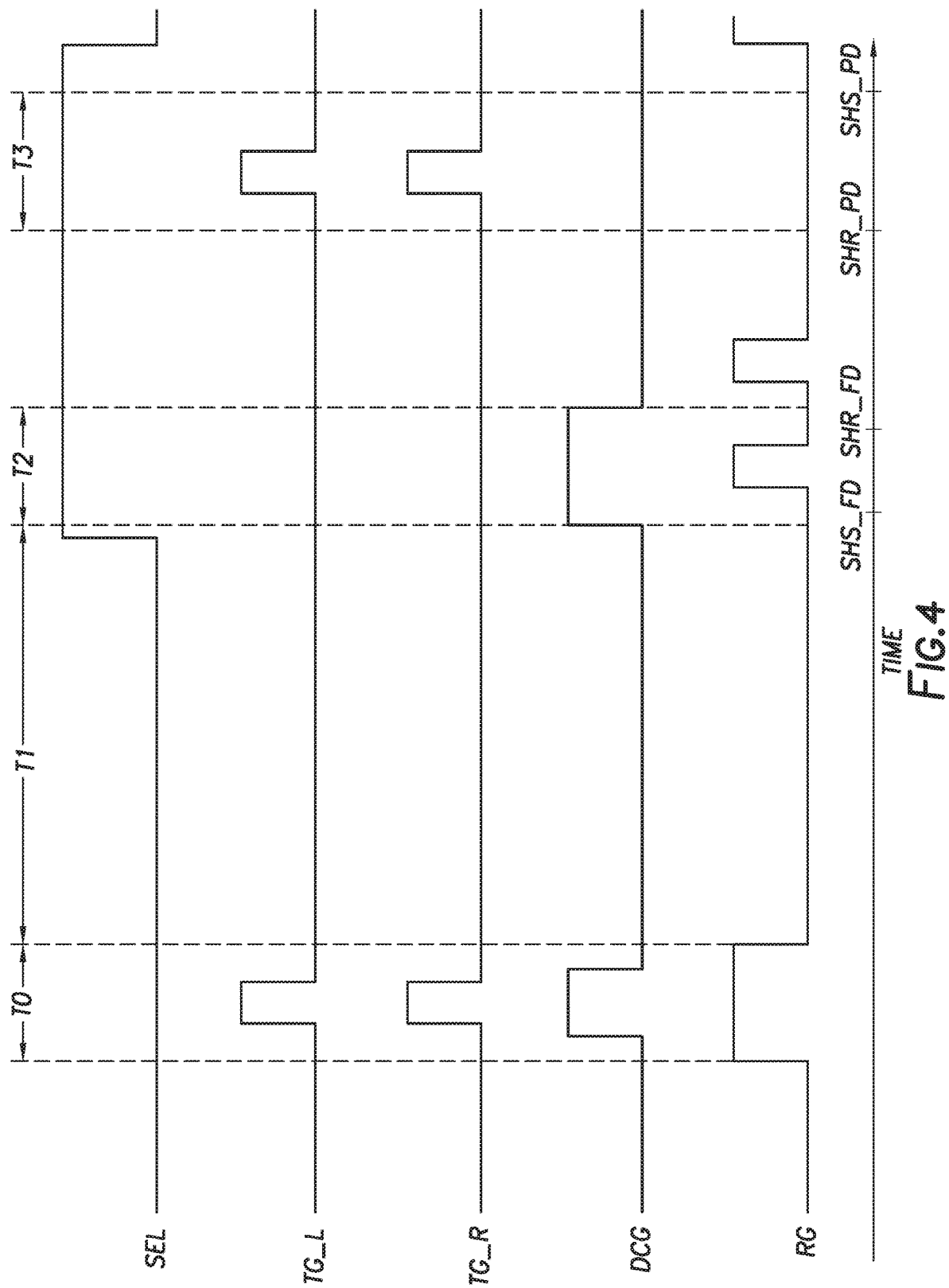
FIG. 4 is a timing diagram for sampling the combined charge from both of the split photodiodes of the illustrative image pixel shown in FIG. 3 in accordance with an embodiment.

FIG. 4 shows a timing diagram for operating the illustrative image sensor pixel shown in FIG. 3 according to a first embodiment. FIG. 4 includes period T0, during which control signal RG may be asserted to reset floating diffusion region 310 to a reset voltage level. During reset period T0, control signals TG_L, TG_R, and DCG may also be asserted to reset photodiodes 302 and dual conversion gain capacitor 312 to the reset level voltage. After resetting the floating diffusion region, photodiodes, and dual conversion gain capacitor during reset period T0, integration period T1 begins. During integration period T1, photodiodes 302 may generate charge in response to light incident on the image sensor pixel. Similarly, floating diffusion region 310 may not be shielded from incident light and may also generate charge in response to incident light. In this way, floating diffusion region 310 serves as an additional photosensitive region during the integration period. Dual conversion gain capacitor 312 may collect any charge that overflows from floating diffusion region 310. Charge may overflow from floating diffusion region 310 once the charge storage capacity of floating diffusion region 310 is exceeded. This may occur during high illumination conditions, for example.

Following period T1, image readout circuitry 28 of FIG. 2, including its sample-and-hold circuitry, may be used to sample the image signals stored in image pixel 300. During period T2, control signal DCG may be asserted to turn on gain select transistor 314 and to sample SHS_FD, the signal stored on one or both of dual conversion gain capacitor 312 and floating diffusion node 310. Because gain select transistor 314 is enabled, SHS_FD is read out as a low conversion gain signal. Control signal RG may then be asserted to reset floating diffusion region 310 and dual conversion gain capacitor 312. A low gain reset value, SHR_FD, may then be sampled. Although a reset value is generally sampled prior to image signals in correlated double sampling, low gain reset value SHR_FD may be used by processing circuitry, such as control and processing circuitry 24 of FIG. 2, in a similar fashion (e.g., double sampling with uncorrelated noise) to reduce the noise and dark current associated with signal SHS_FD. Following the sampling of low gain reset value SHR_FD, control signal DCG may be deasserted and control signal RG may be asserted to reset floating diffusion region 310 to a reset value.

After floating diffusion region 310 has been reset, image readout circuitry 28 may be used to sample the image signals generated by photodiodes 302. During period T3, correlated double sampling may be used to sample the charge generated by photodiodes 302-1 and 302-2. First, a reset value, SHR_PD, may be sampled. In this case, SHR_PD is a high conversion gain reset value, as gain select transistor 314 is off (e.g., control signal DCG has been deasserted). Control signals TG_L and TG_R may then be asserted to transfer the accumulated charge from photodiodes 302-1 and 302-2, allowing the generated charge to be sampled as high conversion gain signal SHS_PD. High gain reset value SHR_PD may be used by processing circuitry 24 to decrease the noise and dark current associated with high gain signal SHS_PD (e.g., through correlated double sampling operations). Following the sampling of high gain signal SHS_PD, control signal SEL may be deasserted and control signal RG may be asserted to reset the image sensor pixel.

Figure 5:
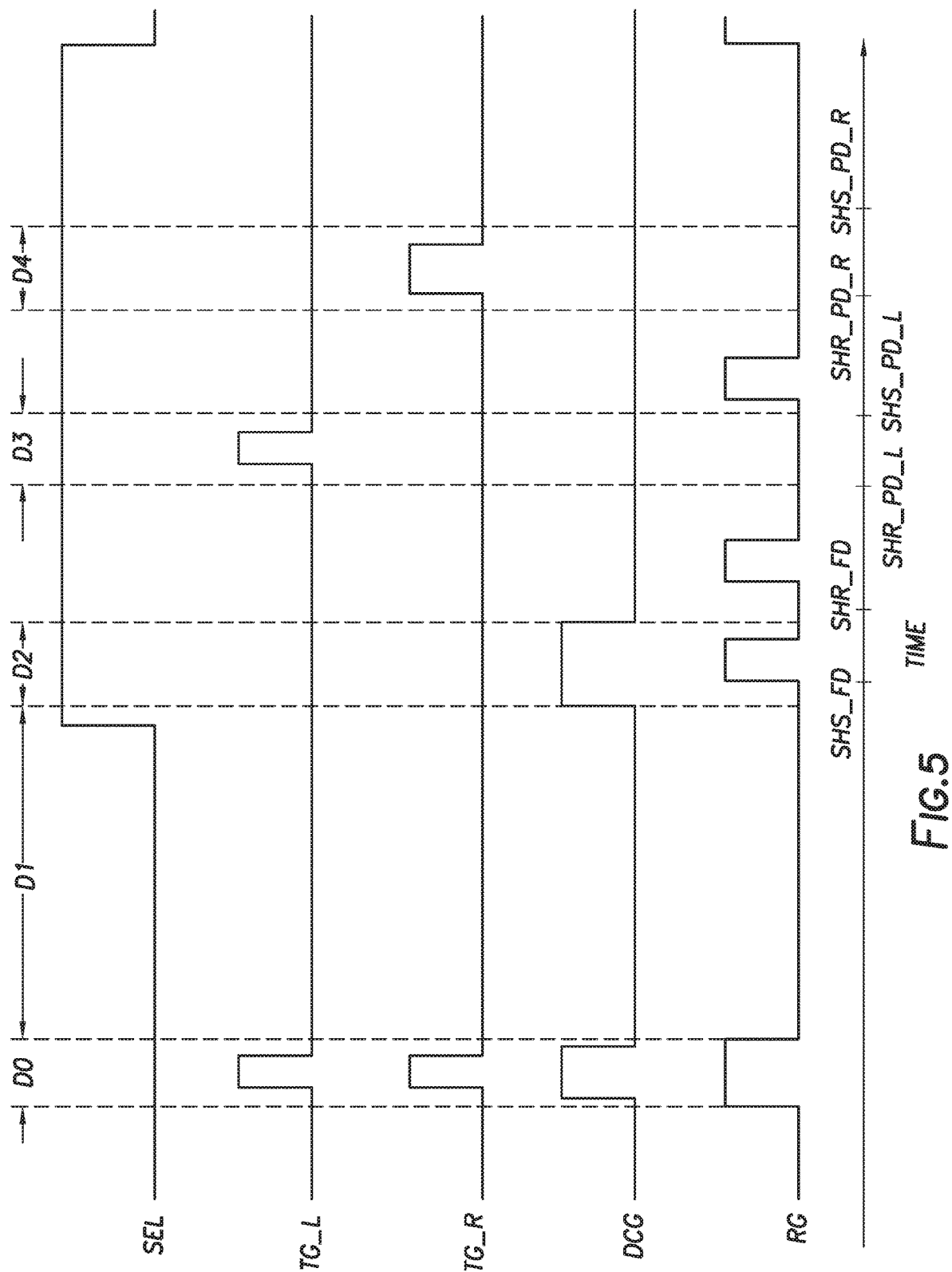
FIG. 5 is a timing diagram for individually sampling charge from each of the split photodiodes of the illustrative image pixel shown in FIG. 3 in accordance with an embodiment.

While control signals TG_L and TG_R are asserted simultaneously in the pixel timing diagram shown in FIG. 4 (meaning the charges from PD_L and PD_R are combined before read out), this is merely an example. As shown in FIG. 5, control signal TG_L may be asserted prior to control signal TG_R (allowing the charge from PD_L and PD_R to be read out separately). Periods D0, D1, and D2 correspond to periods T0, T1, and T2 of FIG. 4. During period D0, control signal RG may be asserted to reset floating diffusion region 310 to a reset voltage level. Control signals TG_L, TG_R, and DCG may also be asserted to reset photodiodes 302 and dual conversion gain capacitor 312 to the reset level voltage.

After resetting the floating diffusion region, photodiodes, and dual conversion gain capacitor during reset period D0, integration period D1 begins. During integration period D1, photodiodes 302 may generate charge in response to light incident on the image sensor pixel. Similarly, floating diffusion region 310 may not be shielded from incident light and may also generate charge in response to incident light. In this way, floating diffusion region 310 serves as an additional photosensitive region during the integration period. Dual conversion gain capacitor 312 may collect any charge that overflows from floating diffusion region 310. Charge may overflow from floating diffusion region 310 once the charge storage capacity of floating diffusion region 310 is exceeded. This may occur during high illumination conditions.

Following period D1, image readout circuitry 28 of FIG. 2, including its sample-and-hold circuitry, may be used to sample the image signals stored in image pixel 300. During period D2, control signal DCG may be asserted to turn on gain select transistor 314 and to sample SHS_FD, the signal stored on one or both of dual conversion gain capacitor 312 and floating diffusion node 310. Because gain select transistor 314 is enabled, SHS_FD is read out as a low conversion gain signal. Control signal RG may then be asserted to reset floating diffusion region 310 and dual conversion gain capacitor 312. A low gain reset value, SHR_FD, may then be sampled. Although a reset value is generally sampled prior to image signals in correlated double sampling, low gain reset value SHR_FD may be used by processing circuitry, such as control and processing circuitry 24 of FIG. 2, in a similar fashion (e.g., double sampling with uncorrelated noise) to reduce the noise and dark current associated with signal SHS_FD. Following the sampling of low gain reset value SHR_FD, control signal DCG may be deasserted and control signal RG may be asserted to reset floating diffusion region 310 to a reset value.

After floating diffusion region 310 has been reset, image readout circuitry 28 may be used to sample the image signals generated by first photodiode 302-1. During period D3, correlated double sampling may be used to sample the charge generated by first photodiode 302-1. First, a first reset value, SHR_PD_L, may be sampled. In this case, SHR_PD_L is a high conversion gain reset value, as gain select transistor 314 is off (e.g., control signal DCG has been deasserted). Control signal TG_L may then be asserted to transfer the accumulated charge from first photodiode 302-1, allowing the generated charge to be sampled as first high conversion gain singal SHS_PD_L. First gain reset value SHR_PD_L may be used by processing circuitry 24 to reduce the noise and dark current associated with first high gain signal SHS_PD_L (e.g., through correlated double sampling operations). Following the readout of first high gain signal SHS_PD_L, control signal RG may be asserted to reset the image sensor pixel.

Following the readout of the charge generated by first photodiode 302-1, image readout circuitry 28 may be used to sample the image signals generated by second photodiode 302-2. During period D4, correlated double sampling may be used to sample the charge generated by second photodiode 302-2. First, a second reset value, SHR_PD_R, may be sampled. In this case, SHR_PD_R is a high conversion gain reset value, as gain select transistor 314 is off (e.g., control signal DCG has been deasserted). Control signal TG_R may then be asserted to transfer the accumulated charge from second photodiode 302-2, allowing the generated charge to be sampled as second high gain signal SHS_PD_R. Second high gain reset signal SHR_PD_R may be used by processing circuitry 24 to reduce the noise and dark current associated with second high gain signal SHS_PD_R (e.g., through correlated double sampling operations). Following the sampling of second high gain signal SHS_PD_R, control signal SEL may be deasserted and control signal RG may be asserted to reset the image sensor pixel.

Reading out the charge generated by first photodiode 302-1 and second photodiode 302-2 individually, as shown in the timing diagram of FIG. 5, may be advantageous in phase detection applications. In particular, first photodiode 302-1 and second photodiode 302-2 may be covered with a single microlens. Each photodiode may therefore have an asymmetric response to incident light. The image signals produced by first photodiode 302-1 may be compared to the image signals produced by second photodiode 302-2 to determine whether or not focusing settings for an imaging system are appropriate (or to create a depth map of the imaged scene). However, this is only an example.

While the charge generated by first photodiode 302-1 is sampled prior to the charge generated by second photodiode 302-2 in the illustrative timing diagram of FIG. 5, this is merely an example. If desired, control signal TG_R may be asserted during period D3, and TG_L may be asserted during period D4, allowing the charge generated by second photodiode 302-2 to be sampled prior to the charge generated by first photodiode 302-1. Moreover, if image sensor pixel 300 includes more than two photodiodes 302, the charge collected by the photodiodes may be sampled simultaneously, individually, or in any other combination.

In the readout schemes shown in FIGS. 4 and 5, charge generated by floating diffusion region 310 is read out in a low conversion gain configuration (e.g., gain select transistor 314 is asserted), while charge generated by photodiodes 302 is read out in a high conversion gain configuration (e.g., gain select transistor 314 is deasserted). Reading out the generated charge in these respective configurations may be beneficial because, in general, floating diffusion region 310 may be configured to detect light in high illumination conditions. In high illumination conditions, high conversion gain may not be necessary. In contrast, photodiodes 302 may be configured to detect light in relatively low illumination conditions. In these cases, higher conversion gain may be beneficial.

It should be noted that the readout schemes described above in connection with FIGS. 4 and 5 are merely illustrative. In general, any desired readout schemes may be used to operate the pixel shown in FIG. 3.

In the imaging pixel of FIG. 3, multiple photodiodes (e.g., first photodiode 302-1 and second photodiode 302-2) share a single charge storage region (e.g., floating diffusion region 310). The location of the charge storage region relative to the photodiodes may impact image sensor performance. For example, if the photodiodes are not arranged symmetrically about the charge storage region, some portions of the photodiodes may be further away from the charge storage region than other portions. Therefore, the charge may transfer from the photodiodes to the charge storage region at different rates. Since some of the charge transfers slower than others, this increases the overall charge transfer time, inducing lag in the image sensor pixel during charge readout. Therefore, it may be advantageous to arrange the photodiodes of pixel 300 symmetrically about charge storage region 310.

Figure 6A:
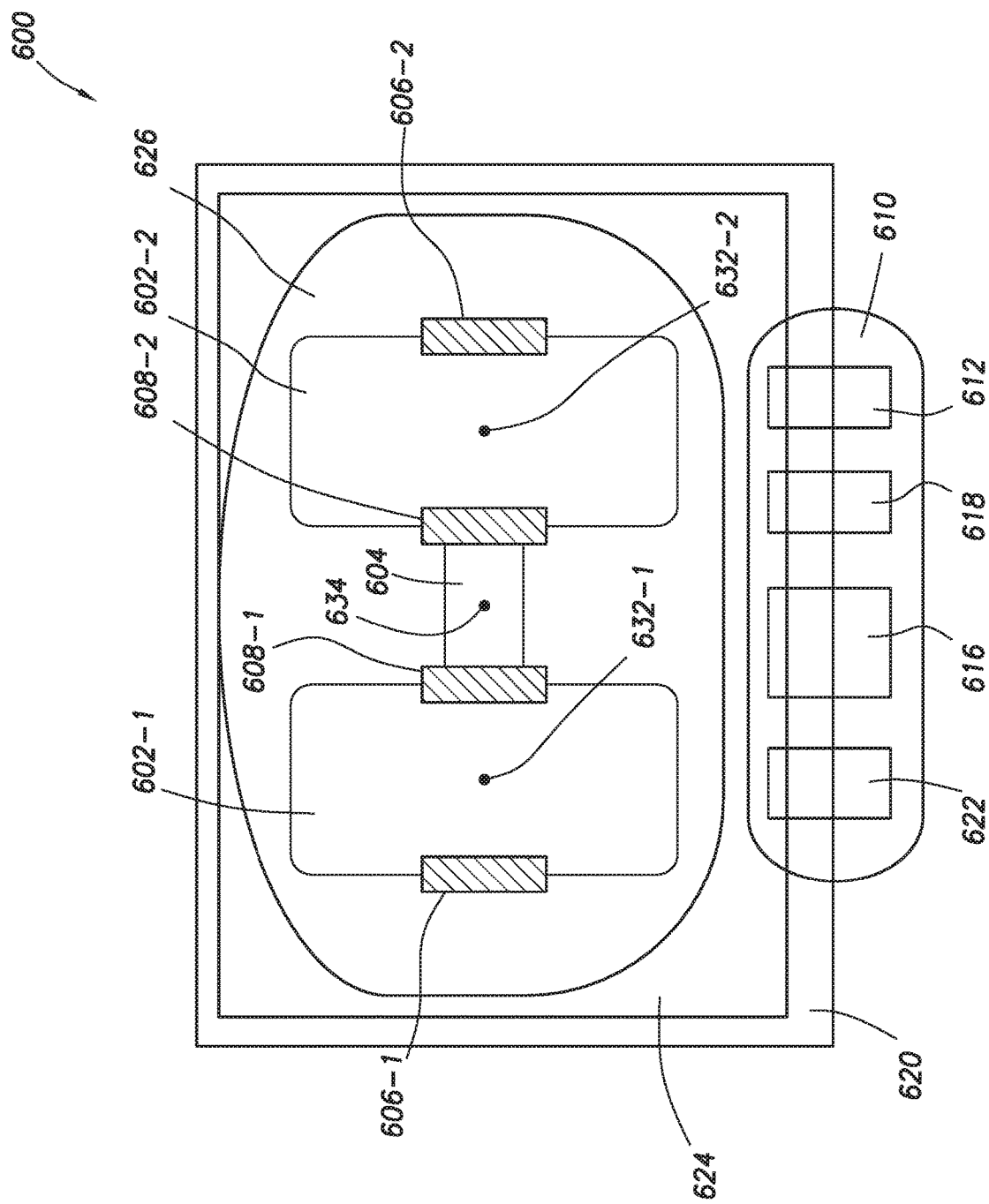
FIG. 6A is a top view of an illustrative image sensor having two symmetric, split photodiodes in accordance with an embodiment.

FIG. 6A shows a top view of an illustrative image pixel, such as image pixel 300 of FIG. 3, having split photodiodes that are symmetric about a shared floating diffusion region. As shown, image sensor pixel 600 may have floating diffusion region 604 coupled to photodiodes 602-1 and 602-2. Photodiodes 602-1 and 602-2 are respectively coupled to anti-blooming transistors 606-1 and 606-2. Transfer transistor 608-1 is coupled between photodiode 602-1 and floating diffusion region 604. Similarly, transfer transistor 608-2 is coupled between photodiode 602-2 and floating diffusion region 604. Floating diffusion region 604 may extend to region 610 and may be coupled to gain select transistor 612 and reset transistor 618. Source-follower transistor 616 is coupled to reset transistor 618 and to row select transistor 622. As an example, image sensor pixel 600, photodiodes 602, floating diffusion region 604, anti-blooming transistors 606, transfer transistors 608, gain select transistor 612, source-follower transistor 616, reset transistor 618, and row select transistor 622 may respectively correspond to image pixel 300, photodiodes 302, floating diffusion region 310, anti-blooming transistors 306, transfer transistors 308, gain select transistor 314, source-follower transistor 316, reset transistor 318, and row select transistor 322 of FIG. 3.

As shown in FIG. 6A, photodiodes 602-1 and 602-2 are symmetric about floating diffusion node 604 (e.g., an axis of symmetry for 602-1 and 602-2 runs through the center 604). As a result, photodiodes 602-1 and 602-2 are equidistant to floating diffusion node 604, and charge may take the same amount of time to transfer from photodiodes 602 to floating diffusion node 604, regardless of the photodiode from which the charge originates. For example, the centers of photodiodes 602 may be equidistant from the center of floating diffusion region 604. As shown in FIG. 6A, the center 632-1 of first photodiode 602-1 may be the same distance from the center 634 of floating diffusion region 604 as the center 632-2 of second photodiode 602-2. Because charge can travel from each photodiode in substantially the same amount of time, charge may travel through image sensor pixel 600 faster and more efficiently, reducing lag when charge is read out from the pixel.

Pixel regions 620 and 624 may be shielded. For example, pixel regions 620 and 624 may be provided with isolation structures to prevent light incident on image sensor pixel 600 from interfering with components 612, 616, 618, and 622. The isolation structures may include different type of isolation devices such as trench isolation structures (e.g., backside deep trench isolation (BDTI)), doped semiconductor regions, metallic barrier structures, or any other suitable isolation structures. Regions 620 and 624 may be completely uncovered, completely covered, or partially covered by the isolation structures.

As depicted in FIG. 6A, photodiodes 602 and floating diffusion region 604 are left uncovered by the isolation structures in regions 620 and 624. This allows photodiodes 602 and floating diffusion region 604 to generate charge (e.g., electrons) based on light impinging upon image sensor pixel 600. A capacitor, such as dual conversion gain capacitor 312 of FIG. 3, may be provided to collect any charge that overflows from floating diffusion region 604, which may occur in high illumination situations. The dual conversion gain capacitor may also be used in combination with gain select transistor 622 by image sensor pixel 600 to implement low and high conversion gain modes.

Photodiodes 602-1 and 602-2 may be covered by a microlens, such as microlens 626 of FIG. 6A. As shown, a single microlens 626 may cover both photodiodes 602-1 and 602-2. This type of arrangement enables phase detection applications. However, this is merely illustrative. In general, any one of first photodiode 602-1, second photodiode 602-2, and floating diffusion region 604 may be covered by one or more microlenses.

The incorporation of at least one microlens in image sensor pixel 600 may be advantageous in phase detection applications when the image output of a first half-pixel (e.g., one of photodiodes 602) is compared to the image output of a second half-pixel (e.g., the second of photodiodes 602) to determine a phase difference (e.g., for determining whether or not focusing settings for an imaging system are appropriate). More than one pixel may be used in phase detection applications, as multiple first half-pixels in an array of image pixels may be compared to multiple second half-pixels in the array of image pixels.

Figure 6C:
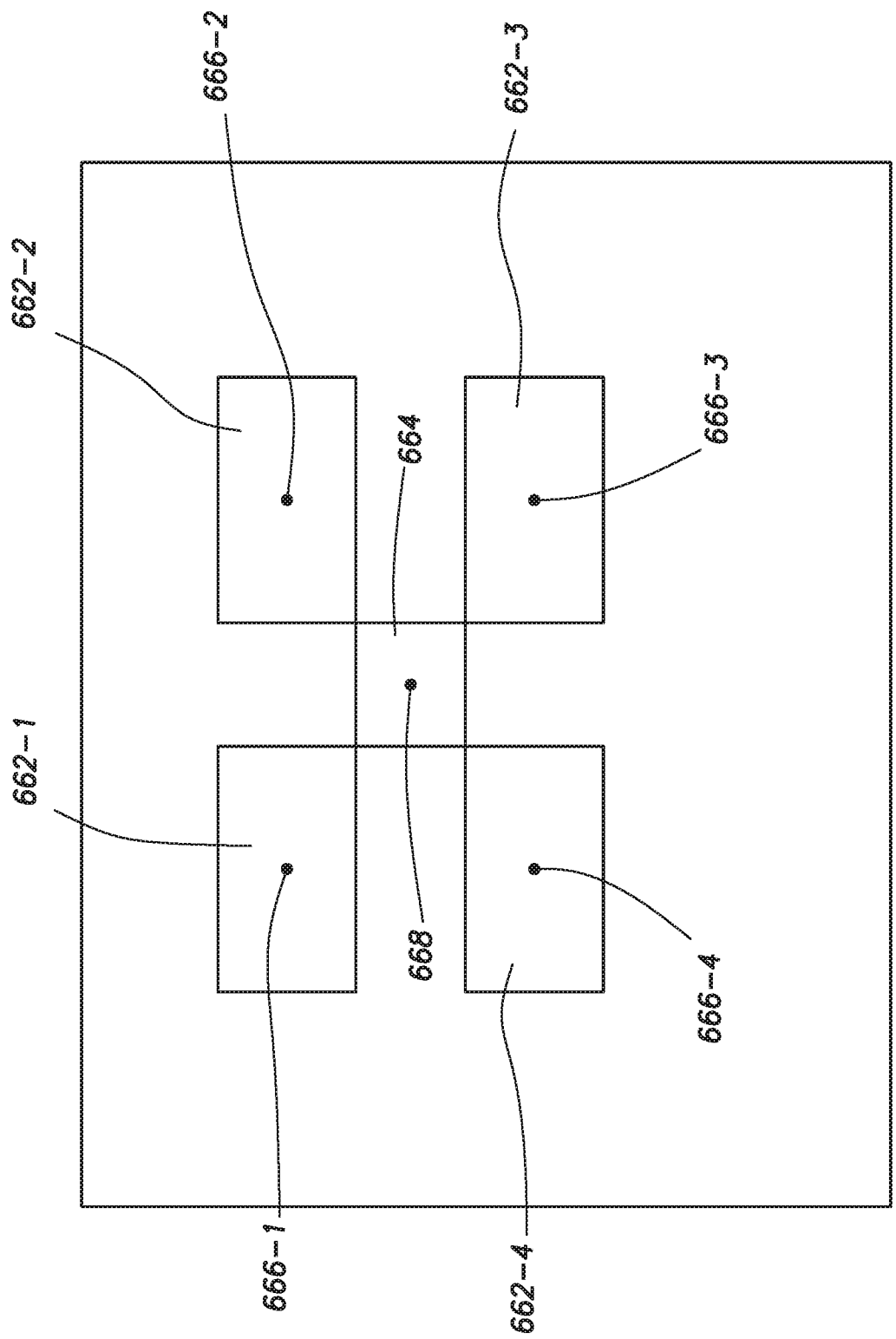
FIG. 6C is a top view of an illustrative image sensor having four symmetric, split photodiodes in accordance with an embodiment.

In FIG. 6A, image sensor pixel 600 has two photodiodes 602-1 and 602-2 that are symmetric about floating diffusion region 604. However, this is merely an example. As shown in FIG. 6B, an image sensor pixel may have three photodiodes 652-1, 652-2, and 652-3 that are symmetric about floating diffusion region 654. The centers 656 of photodiodes 652 (e.g., center 656-1, center 656-2, and center 656-3) may be equidistant from the center 658 of floating diffusion region 654. Alternatively, as shown in FIG. 6C, an image sensor pixel may have four photodiodes 662-1, 662-2, 662-3, and 662-4 that are symmetric about floating diffusion region 664. The centers 666 of photodiodes 662 (e.g., center 666-1, center 666-2, center 666-3, and center 666-4) may be equidistant from the center 668 of floating diffusion region 664. However, these arrangements are merely illustrative. An image sensor pixel may have more than four photodiodes if desired. Preferably, the photodiodes in each of these cases are symmetric about a shared floating diffusion region, allowing charge to travel through image sensor pixel 600 faster, reducing lag and improving the pixel's readout. In an image sensor pixel that includes four photodiodes, for example, each of the photodiodes may be positioned near a corner of the floating diffusion region, as shown in FIG. 6C. Alternatively, each of the photodiodes may be adjacent to each of the edges of the floating diffusion region. Although the distance between each of the symmetric photodiodes and floating diffusion region is preferably minimized to minimize the time charge takes to travel through the image sensor pixel, the photodiodes may be offset from the floating diffusion region by any desired distance.

Figure 7:
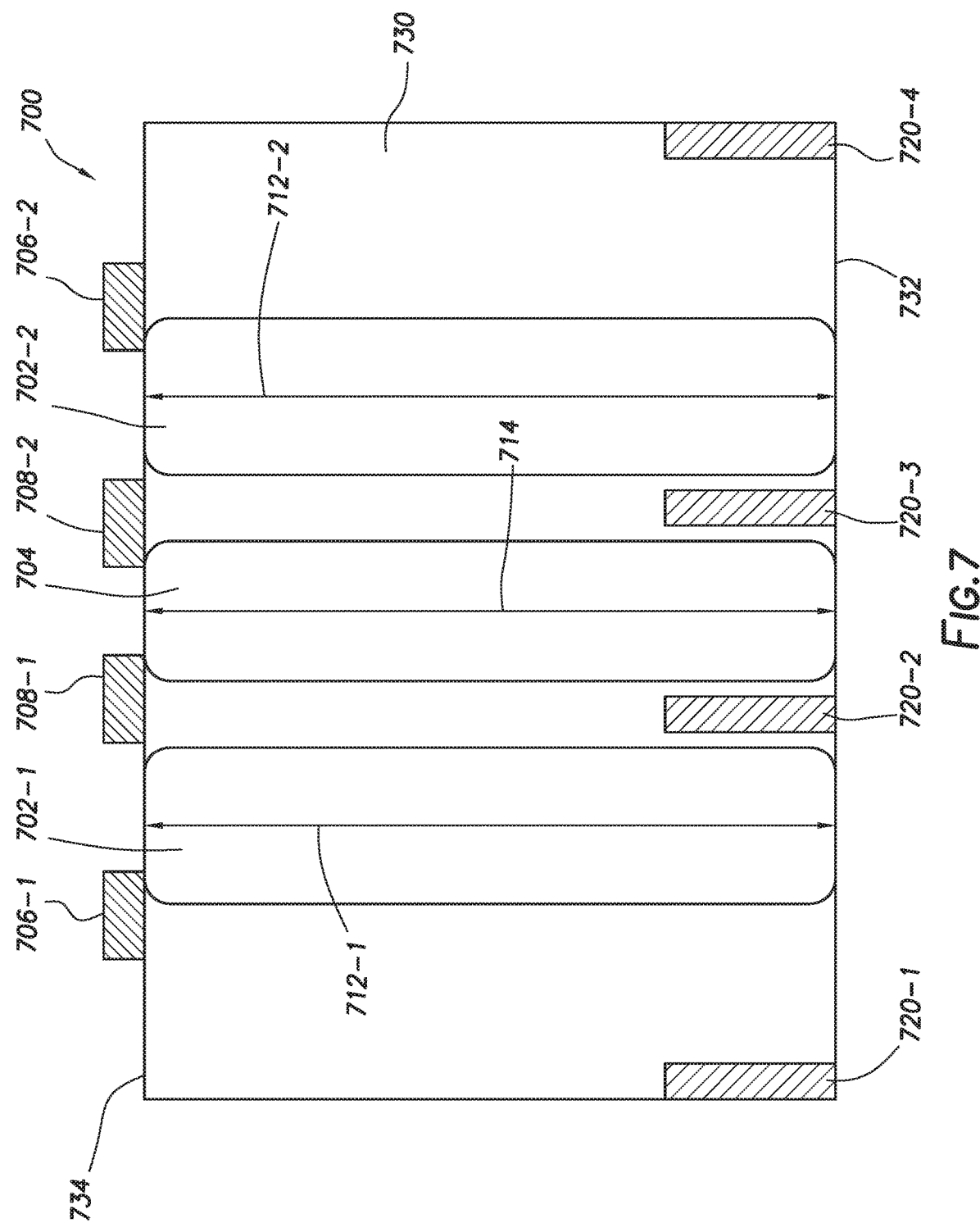
FIG. 7 is a side view of an illustrative image sensor having symmetric, split photodiodes in accordance with an embodiment.

A cross-section of an illustrative image sensor pixel, which may correspond to image sensor pixel 600 of FIG. 6A, is shown in FIG. 7. Image sensor pixel 700 may have photodiodes 702-1 and 702-2 and floating diffusion region 704 formed in substrate 730. As shown in FIG. 7, photodiodes 702 and floating diffusion region 704 may be deep well implants. In FIG. 7, photodiodes 702 and floating diffusion region 704 are shown as extending from a front surface 732 of substrate 730 to a back surface 734 of substrate 730 (e.g., across the entire width of substrate 730). However, photodiodes 702 and floating diffusion region 704 may not extend completely from the front surface to the back surface of substrate 730. Photodiodes 702 and floating diffusion region 730 may extend to within one micron of the front surface of substrate 730, to within 10 microns of the front surface of substrate 730, to within 0.5 microns of the front surface of substrate 730, to within greater than 0.1 microns of the front surface of substrate 730, or to within less than 0.5 microns of the front surface of substrate 730. Photodiodes 702 and floating diffusion region 704 may be n-type doped regions and substrate 730 may be a bulk p-type substrate made of silicon or any other suitable semiconductor material. Alternatively, photodiodes 702 and floating diffusion region 704 may be p-type doped regions and substrate 730 may be an n-type substrate. Photodiodes 702 and floating diffusion region 704 may respectively correspond to photodiodes 602 and floating diffusion region 604 of FIG. 6.

As shown in FIG. 7, floating diffusion region 704 has a similar structure to photodiodes 702 (e.g., a deep well implant structure). For example, the height 714 of floating diffusion region 704 may be the same as the heights 712 of photodiodes 702. However, this is merely an example. The height 714 of floating diffusion region 704 may be within 1% of the heights 712 of photodiodes 702, within 5% of the heights 712 of photodiodes 702, within 10% of heights 712 of photodiodes 702, within 20% of the heights 712 of photodiodes 702, within less than 20% of the heights 712 of photodiodes 702, or within greater than 10% of the heights of the 712 of photodiodes 702, as examples. Additionally, floating diffusion region 704 (as well as photodiodes 702) may not be covered (e.g., may be exposed to incoming light). Floating diffusion region 704 may therefore be a third photosensitive region in image sensor pixel 700 (in addition to photodiodes 702-1 and 702-2). The symmetry of photodiodes 702 about floating diffusion region 704 allows for efficient charge transfer within image sensor pixel 700.

FIG. 7 also shows transfer transistors 708 and anti-blooming transistors 706, which may correspond to transfer transistors 608 and anti-blooming transistors 606 of FIG. 6. Isolation regions 720 are also depicted, which may correspond to region 620 of FIG. 6. Isolation regions 720 may be shallow trench isolation structures or deep trench isolation structures, as examples. Any suitable isolation structures, including trench isolation structures, doped semiconductor regions, and metallic barrier structures may be used in isolation regions 720. As shown, isolation regions 720 may be similarly sized. However, isolation regions 720 may all be the same size, may all have different sizes, or may have some regions that are the same size and some that are not. For example, intra-pixel isolation regions 720-2 and 720-3 may be smaller than inter-pixel isolation regions 720-1 and 720-4. In general, isolation regions 720 may be any size or shape. Regardless of the size or shape of isolation regions 720, however, photodiodes 702 and floating diffusion region 704 may remain uncovered by isolation regions 720 so that they may generate charge in response to light incident on image sensor pixel 700.

Although not shown in FIG. 7, microlenses, such as microlens 626 of FIG. 6, may cover photodiodes 702 and floating diffusion region 704. In particular, at least one microlens may cover photodiodes 702-1 and 702-2 and floating diffusion region 704. The incorporation of a microlens that covers photodiodes 702 and floating diffusion region 704 may be advantageous in phase detection applications when the image output of a first half-pixel (e.g., one of photodiodes 702) is compared to the image output of a second half-pixel (e.g., the second of photodiodes 702) to determine phase difference (e.g., for determining whether or not focusing settings for an image sensor are appropriate).

While FIG. 7 depicts a backside illuminated image sensor pixel, image sensor pixel 700 is not limited to this arrangement. If desired, image sensor pixel 700 may instead be a front-side illuminated image sensor pixel.

Various embodiments have been described illustrating image sensor pixels having split photodiodes that are symmetric about a shared charge storage region (e.g., a floating diffusion region).

In various embodiments of the present invention, an image sensor pixel may have a first photosensitive region, a second photosensitive region, and a third photosensitive region about which the first and second photosensitive regions are symmetric. The image sensor pixel may be formed in a semiconductor substrate having first and second opposing surfaces. The first photosensitive region, the second photosensitive region, and the floating diffusion region may have respective first, second, and third heights. The third height may be within 20% of the first height and within 20% of the second height. The first photosensitive region, the second photosensitive region, and the floating diffusion region may each be n-type doped regions of the semiconductor substrate. In some embodiments, the first photosensitive region, the second photosensitive region, and the floating diffusion region may extend from the first surface of the semiconductor substrate to within 1 micron of the second surface of the semiconductor substrate.

A microlens may cover the first photodiode, the second photodiode, and the floating diffusion region. The semiconductor substrate may include isolation structures, which may be deep trench isolation structures. In some embodiments, the first photodiode, the second photodiode, and the floating diffusion region may extend from the first surface to within 1 micron of the second surface.

In accordance with an embodiment, a dual conversion gain capacitor that is configured to store overflow charge generated by the floating diffusion region may be coupled to the floating diffusion region. A gain select transistor may be coupled between the floating diffusion region and the dual conversion gain transistor and may be turned on to provide the floating diffusion region with increased capacitance.

In various embodiments, the image sensor pixel may have column readout circuitry that is coupled to the floating diffusion region. The column readout circuitry may read out the charge generated by the floating diffusion region, followed by the charge generated by the first and second photodiodes. In some embodiments, the column readout circuitry may read out the charge generated by the first and second photodiodes simultaneously. In other embodiments, the column readout circuitry may read out the charge generated by the first photodiode prior to reading out the charge generated by the second photodiode. The gain select transistor may be enabled when the charge generated by the floating diffusion region is read out, while the gain select transistor may be disabled when the charge generated by the first photodiode and the second photodiode is read out.

In some embodiments, an image sensor pixel having a first photosensitive region, a second photosensitive region, and a floating diffusion region may be operated by generating charge in the first photosensitive region, the second photosensitive region, and the floating diffusion region during an integration time. After generating the charge, the charge generated by the floating diffusion region may be read out, followed by the charge generated by the first and second photosensitive regions. According to some embodiments, the charge generated by the first and second photosensitive regions may be read out simultaneously. The image sensor pixel may also reset the floating diffusion region to a first reset value and read out the first reset value after reading out the charge generated by the floating diffusion region, and reset the image sensor pixel to a second reset value associated with the first and second photosensitive regions and read out the second reset value after reading out the first reset value.

According to other embodiments, the charge generated by the first photosensitive region may be read out prior to the charge generated by the second photosensitive region. The image sensor pixel may reset the floating diffusion region to a first reset value and read out the first reset value after reading out the charge generated by the floating diffusion region, reset the image sensor pixel to a second reset value associated with the first photosensitive region and read out the second reset value after reading out the first reset value, and reset the image sensor pixel to a third reset value associated with the second photosensitive region and read out the third reset value after reading out the charge generated by the first photosensitive region.

The image sensor pixel may also have a dual conversion gain capacitor coupled to the floating diffusion region and a gain select transistor coupled between the dual conversion gain capacitor and the floating diffusion region. The gain select transistor may be activated after the integration time, and the charge generated by the floating diffusion region may be read out while the gain select transistor is activated. After the charge generated by the floating diffusion region is read out, the gain select transistor may be deactivated, and the charge generated by the first and second photosensitive regions may be read out while the gain select transistor is deactivated.

The foregoing is merely illustrative and various modifications can be made to the described embodiments. The foregoing embodiments may be implemented individually or in any combination.

What is claimed is:

1. An image sensor pixel that is configured to generate image signals in response to light, the image sensor pixel comprising:
   a first photosensitive region that is configured to generate charge in response to the light;
   a second photosensitive region that is configured to generate charge in response to the light;
   a floating diffusion region that is configured to generate charge in response to the light, wherein the floating diffusion region is coupled to the first photosensitive region and the second photosensitive region and wherein the first photosensitive region and the second photosensitive region are symmetric about the floating diffusion region; and
   a semiconductor substrate having opposing first and second surfaces, wherein the first and second photosensitive regions and the floating diffusion region extend from the first surface to the second surface.

2. The image sensor pixel defined in claim 1, further comprising:
   a microlens that covers the first photosensitive region, the second photosensitive region, and the floating diffusion region.

3. The image sensor pixel defined in claim 2, further comprising:
   isolation structures in the semiconductor substrate, wherein the isolation structures are interposed between the first photosensitive region, the second photosensitive region, and the floating diffusion region and wherein the first photosensitive region, the second photosensitive region, and the floating diffusion region are left uncovered by the isolation structures.

4. The image sensor pixel defined in claim 3, wherein the isolation structures comprise deep trench isolation structures.

5. The image sensor pixel defined in claim 1, further comprising:
   a dual conversion gain capacitor coupled to the floating diffusion region, wherein the dual conversion gain capacitor is configured to store overflow charge generated by the floating diffusion region.

6. The image sensor pixel defined in claim 5, further comprising:
   a gain select transistor coupled between the floating diffusion region and the dual conversion gain capacitor, wherein the gain select transistor is configured to be turned on to electrically connect the floating diffusion region to the dual conversion gain capacitor and provide the floating diffusion region with additional capacitance.

7. The image sensor pixel defined in claim 6, further comprising:
   column readout circuitry coupled to the floating diffusion region, wherein the column readout circuitry is configured to read out the charge generated by the floating diffusion region and the first and second photosensitive regions.

8. The image sensor pixel defined in claim 7 wherein the gain select transistor is configured to be turned on while the charge generated by the floating diffusion region is read out and wherein the gain select transistor is configured to be turned off while the charge generated by the first and second photosensitive regions is read out.

9. An image sensor pixel, comprising:
   a semiconductor substrate with first and second opposing surfaces;
   a first photosensitive region in the semiconductor substrate that extends from the first surface towards the second surface and has a first height;
   a second photosensitive region in the semiconductor substrate that extends from the first surface towards the second surface and has a second height; and
   a floating diffusion region in the semiconductor substrate that is coupled to the first photosensitive region and the second photosensitive region, wherein the floating diffusion region extends from the first surface towards the second surface and has a third height, wherein the third height is within 20% of the first height, and wherein the third height is within 20% of the second height.

10. The image sensor pixel defined in claim 9, further comprising:
    a microlens that covers the first photosensitive region, the second photosensitive region, and the floating diffusion region.

11. The image sensor pixel defined in claim 9, wherein the first photosensitive region, the second photosensitive region, and the floating diffusion region are each n-type doped regions of the semiconductor substrate.

12. The image sensor pixel defined in claim 11, wherein the first photosensitive region, the second photosensitive region, and the floating diffusion region extend from the first surface to within 1 micron of the second surface.

13. A method of operating an image sensor pixel that includes first and second photosensitive regions, a floating diffusion region, a first transfer transistor between the first photosensitive region and the floating diffusion region, and a second transfer transistor between the second photosensitive region and the floating diffusion region, the method comprising:

with the first photosensitive region, the second photosensitive region, and the floating diffusion region, generating charge during an integration time;

after generating the charge, reading out charge generated by the floating diffusion region; and after reading out the charge generated by the floating diffusion region, reading out charge generated by the first photosensitive region and the second photosensitive region.

14. The method defined in claim 13, wherein reading out the charge generated by the first photosensitive region and the second photosensitive region comprises reading out the charge generated by the first photosensitive region and the second photosensitive region simultaneously.

15. The method defined in claim 14, further comprising:

after reading out the charge generated by the floating diffusion region, resetting the floating diffusion region to a first reset value;

reading out the first reset value;

after reading out the first reset value, resetting the floating diffusion region to a second reset value; and reading out the second reset value.

16. The method defined in claim 13, wherein reading out the charge generated by the first photosensitive region and the second photosensitive region comprises reading out the charge generated by the first photosensitive region prior to reading out the charge generated by the second photosensitive region.

17. The method defined in claim 16, further comprising:

after reading out the charge generated by the floating diffusion region, resetting the floating diffusion region to a first reset value;

reading out the first reset value;

after reading out the first reset value, resetting the floating diffusion region to a second reset value associated with the first photosensitive region;

reading out the second reset value;

after reading out the charge generated by the first photosensitive region, resetting the floating diffusion region to a third reset value associated with the second photosensitive region; and reading out the third reset value.

18. The method defined in claim 13, wherein the image sensor pixel further comprises a dual conversion gain capacitor coupled to the floating diffusion region and a gain select transistor coupled between the dual conversion gain capacitor and the floating diffusion region, the method further comprising:

after generating the charge during the integration time, activating the gain select transistor, wherein reading out the charge generated by the floating diffusion region comprises reading out the charge generated by the floating diffusion region while the gain select transistor is activated.

19. The method defined in claim 18, further comprising:

after reading out the charge generated by the floating diffusion region, deactivating the gain select transistor, wherein reading out the charge generated by the first photosensitive region and the second photosensitive region comprises reading out the charge generated by the first photosensitive region and the second photosensitive region while the gain select transistor is deactivated.

* * * * *